(12) United States Patent
Mendoza-Tellez et al.

(10) Patent No.: US 11,955,724 B2
(45) Date of Patent: Apr. 9, 2024

(54) ANTENNA AND TUNING FOR KEY FOB WITH FOUR BAND OPERATION

(71) Applicant: Continental Automotive Systems, Inc., Auburn Hills, MI (US)

(72) Inventors: Hazael Alejandro Mendoza-Tellez, Tlajomulco de Zuniga (MX); Jesus Enrique Saavedra Balbi, Guadalajara (MX); Eric Ponce, Rochester Hills, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 366 days.

(21) Appl. No.: 17/416,397

(22) PCT Filed: Dec. 21, 2019

(86) PCT No.: PCT/US2019/068198
§ 371 (c)(1),
(2) Date: Jun. 28, 2021

(87) PCT Pub. No.: WO2020/139786
PCT Pub. Date: Jul. 2, 2020

(65) Prior Publication Data
US 2022/0077580 A1 Mar. 10, 2022

Related U.S. Application Data

(60) Provisional application No. 62/785,417, filed on Dec. 27, 2018.

(51) Int. Cl.
*H01Q 5/307* (2015.01)
*B60R 25/04* (2013.01)
(Continued)

(52) U.S. Cl.
CPC ............ *H01Q 5/307* (2015.01); *B60R 25/24* (2013.01); *H01Q 1/273* (2013.01); *H03H 7/38* (2013.01); *B60R 25/04* (2013.01)

(58) Field of Classification Search
CPC ........ H01Q 5/307; H01Q 1/273; B60R 25/24; B60R 25/04; H03H 7/38; H04B 1/0458; H04B 1/0064
See application file for complete search history.

(56) References Cited

U.S. PATENT DOCUMENTS 8,581,696 B2 11/2013 Ghabra et al.
2003/0117261 A1 6/2003 Gunsch
(Continued)

FOREIGN PATENT DOCUMENTS

CN 108880596 A 11/2018

OTHER PUBLICATIONS

Belguessoum et al. "A novel dual frequency operation of CPW coupled patch antenna", Antennas and Propogation Symposium, 2005, IEEE, Washington, DC, Jul. 3-8, 2005, Piscataway, NJ: IEEE US, vol. 1A, Jul. 3, 2005, p. 446, XP010857903, DOI: 10.1109/APS.2005.1551349 ISBN: 978-0-7803-8883-3.
(Continued)

*Primary Examiner* — Daniel D Chang

(57) ABSTRACT

A remote signal communication system includes a first antenna that transmits first frequency bands and a second antenna that transmits second frequency bands that are higher than the first frequency bands. A first dual matching network is provided for the first frequency bands and a second dual matching network is provided for the second frequency bands.

18 Claims, 2 Drawing Sheets

(51) Int. Cl.
    *B60R 25/24*      (2013.01)
    *H01Q 1/27*       (2006.01)
    *H03H 7/38*       (2006.01)

(56)                References Cited

U.S. PATENT DOCUMENTS

2007/0026898 A1    2/2007   Nantz et al.
2009/0231094 A1    9/2009   Higgins et al.
2014/0044022 A1*   2/2014   Matsuo .................. H04B 1/006
                                                         370/278
2017/0054212 A1    2/2017   Liu

OTHER PUBLICATIONS

International Search Report and Written Opinion dated Apr. 15, 2020 from corresponding International Patent Application No. PCT/US2019/068198.

* cited by examiner

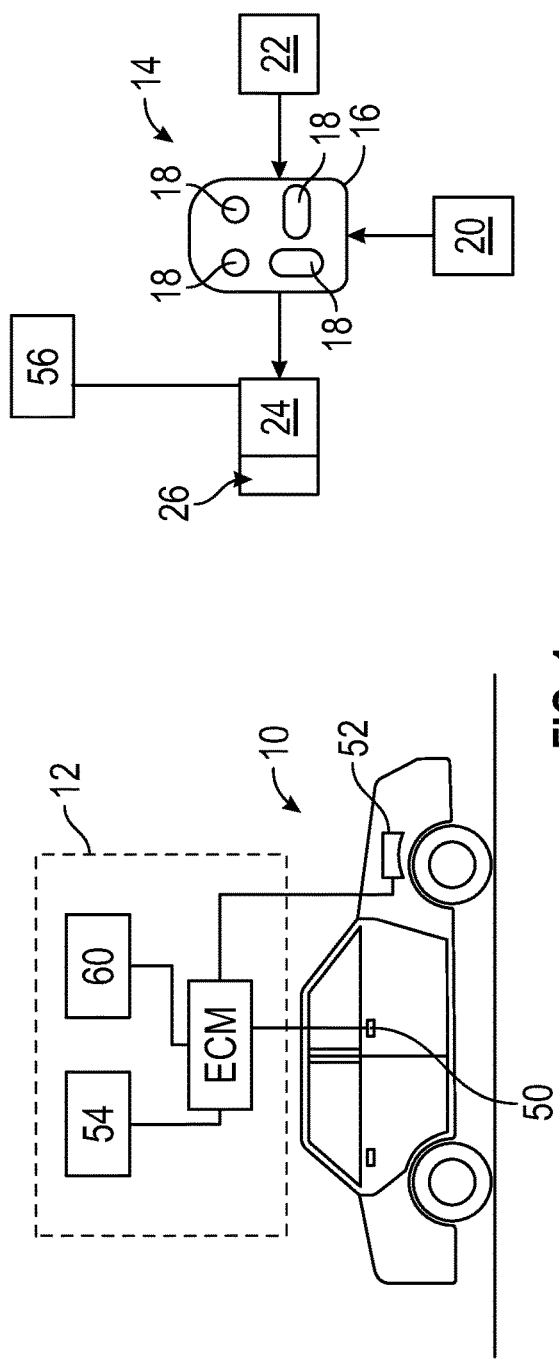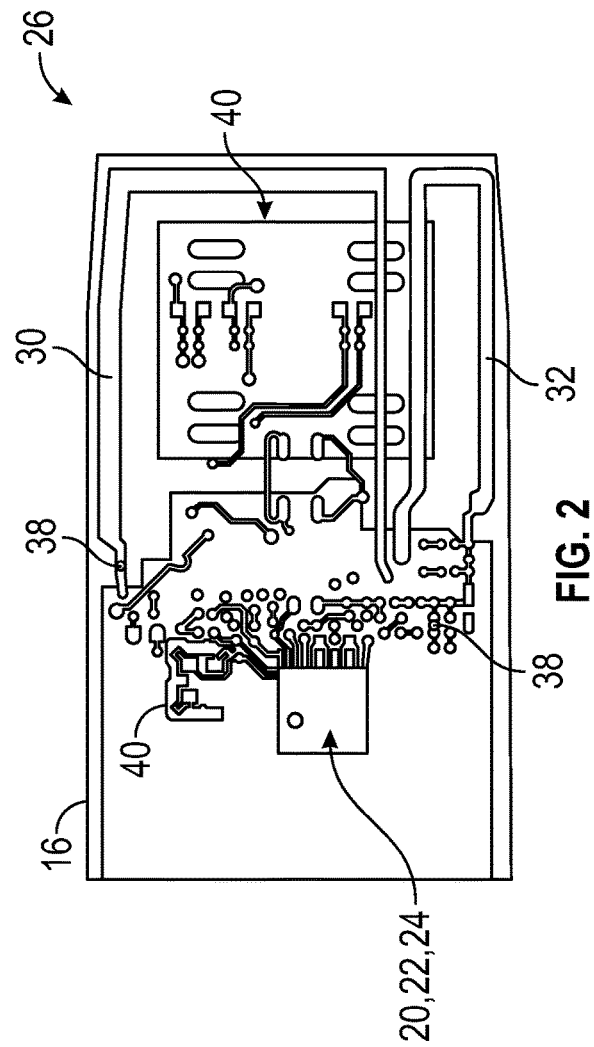

ANTENNA AND TUNING FOR KEY FOB WITH FOUR BAND OPERATION

PRIORITY CLAIM

This application claims the benefit of U.S. Provisional Application No. 62/785,417 filed on Dec. 27, 2018.

TECHNICAL FIELD

The subject disclosure concerns an antenna and tuning system for a remote signal communication system, and more particularly to an antenna and tuning system that includes a four band operation.

BACKGROUND

Vehicles can include a variety of remote signal communication systems. Radio frequency (RE) signals are a communication mode in systems such as remote keyless entry systems (RKE) and passive entry and starting systems (PASE), for example. Such systems typically include a transmitter, such as a key fob, smart key, or smart card, for example, which provides a signal to a receiver module located on the vehicle. The receiver module actuates a vehicle system in response to transmissions received from the transmitter. The receiver module may unlock a vehicle door in response to transmissions received from the transmitter where the system controlled by the transmitter is a RKE system, for example. In another example, the doors of a vehicle are automatically unlocked where the transmitter is within a predefined range from the vehicle and the system controlled by the transmitter is a PASE system. The automotive industry is always pursing smaller, more powerful, and less expensive electronic solutions for these types of remote signal communication systems.

SUMMRY

The subject disclosure provides, among other things, a more compact remote signal communication system that can also operate with a high level of efficiency.

In one exemplary embodiment, a remote signal communication system includes a first antenna that transmits first frequency bands and a second antenna that transmits second frequency bands that are higher than the first frequency bands. A first dual matching network is provided for the first frequency bands and a second dual matching network is provided for the second frequency bands.

In another embodiment according to the previous embodiment, the first antenna is larger than the second antenna.

In another embodiment according to any of the previous embodiments, the first frequency bands comprise a first frequency and a second frequency that is higher than the first frequency, and wherein the second frequency bands comprise a third frequency that is higher than the second frequency and a fourth frequency that is higher than the third frequency.

In another embodiment according to any of the previous embodiments, the first and second antennas are mounted to a support structure that comprises a remote communication device that communicates with a vehicle remote communications unit.

In another embodiment according to any of the previous embodiments, the first dual matching network comprises a first dual band matching circuit comprised of a first set of components to create a cascade tuning circuit, and wherein the second dual matching network comprises a second dual band matching circuit comprised of a second set of components to provide two tuning circuits.

In another embodiment according to any of the previous embodiments, the first set of components creates two different resonances in an antenna response, and wherein the first set of components include a first capacitor and a first inductor and a second capacitor and a second inductor, and wherein the first capacitor is directly between ground and the first inductor, which is in series with the second capacitor, and wherein the second inductor is connected to ground.

In another embodiment according to any of the previous embodiments, the first set of components feed into an antenna branch of the first dual hand matching circuit that includes a third capacitor in series with a fourth capacitor that is connected to ground.

In another embodiment according to any of the previous embodiments, the second set of components includes a pi network with first and second branches that present a different impedance for each frequency.

In another embodiment according to any of the previous embodiments, the first and second branches each include three components with a first inductor being connected between ground and the first branch, and wherein the first branch includes a first capacitor, a second capacitor, and a second inductor, and wherein the second branch includes a third inductor, a fourth inductor, and a third capacitor.

In another embodiment according to any of the previous embodiments, first and second capacitors are in parallel and the second inductor is in series with the second capacitor, and wherein the third inductor is in series with the third capacitor which is in parallel to the fourth inductor.

In another embodiment according to any of the previous embodiments, the second set of components feed into an antenna branch of the second dual band matching circuit that includes a fourth capacitor in series with a fifth capacitor that is connected to ground.

In another exemplary embodiment, a remote signal communication system includes a first antenna that transmits first frequency bands and a second antenna that transmits second frequency bands that are higher than the first frequency bands, and wherein the first and second antennas are mounted to a support structure that comprises a remote communication device that communicates with a vehicle remote communications unit. A first dual matching network is provided for the first frequency bands and a second dual matching network is provided for the second frequency bands. The first frequency bands comprise a first frequency and a second frequency that is higher than the first frequency, and wherein the second frequency bands comprise a third frequency that is higher than the second frequency and a fourth frequency that is higher than the third frequency.

In another embodiment according to any of the previous embodiments, the first antenna is larger than the second antenna.

In another embodiment according to any of the previous embodiments, the first dual matching network comprises a first dual band matching circuit comprised of a first set of components to create a cascade tuning circuit, and wherein the second dual matching network comprises a second dual hand matching circuit comprised of a second set of components to provide two tuning circuits.

In another embodiment according to any of the previous embodiments, the first set of components includes only four components that create two different resonances in an antenna response, and wherein the second set of components includes only seven components to provide two tuning circuits.

In another embodiment according to any of the previous embodiments, the first set of components includes a first capacitor and a first inductor and a second capacitor and a second inductor, and wherein the first capacitor is directly between ground and the first inductor, which is in series with the second capacitor, and wherein the second inductor is connected to ground.

In another embodiment according to any of the previous embodiments, the first set of components feed into an antenna branch of the first dual band matching circuit that includes a third capacitor in series with a fourth capacitor that is connected to ground.

In another embodiment according to any of the previous embodiments, the second set of components includes a pi network with first and second branches that present a different impedance for each frequency, and wherein the first and second branches each include three components with a first inductor being connected between ground and the first branch, and wherein the first branch includes a first capacitor, a second capacitor, and a second inductor, and wherein the second branch includes a third inductor, a fourth inductor, and a third capacitor.

In another embodiment according to any of the previous embodiments, first and second capacitors are in parallel and the second inductor is in series with the second capacitor, and wherein the third inductor is in series with the third capacitor which is in parallel to the fourth inductor, and wherein the second set of components feed into an antenna branch of the second dual band matching circuit that includes a fourth capacitor in series with a fifth capacitor that is connected to ground.

An exemplary method includes, among other things, providing a first antenna and a second antenna that are associated with a support structure that comprises a remote communication device that communicates with a vehicle remote communications unit; transmitting first frequency bands with the first antenna; transmitting second frequency bands with the second antenna, wherein the second frequency bands are higher than the first frequency bands; providing a first dual matching network for the first frequency bands that creates a cascade tuning circuit that generates two resonances in an antenna response; and providing a second dual matching network for the second frequency bands that includes a pi network with first and second branches that present a different impedance for each frequency.

BRIEF DESCRIPTION OF THE DRAWINGS

The disclosure can be further understood by reference to the following detailed description when considered in connection with the accompanying drawings Wherein:

FIG. 1 is a schematic illustration of a vehicle and a remote signal communication system.

FIG. 2 is a schematic diagram of an antenna system for the remote signal communication system.

Figure 3:
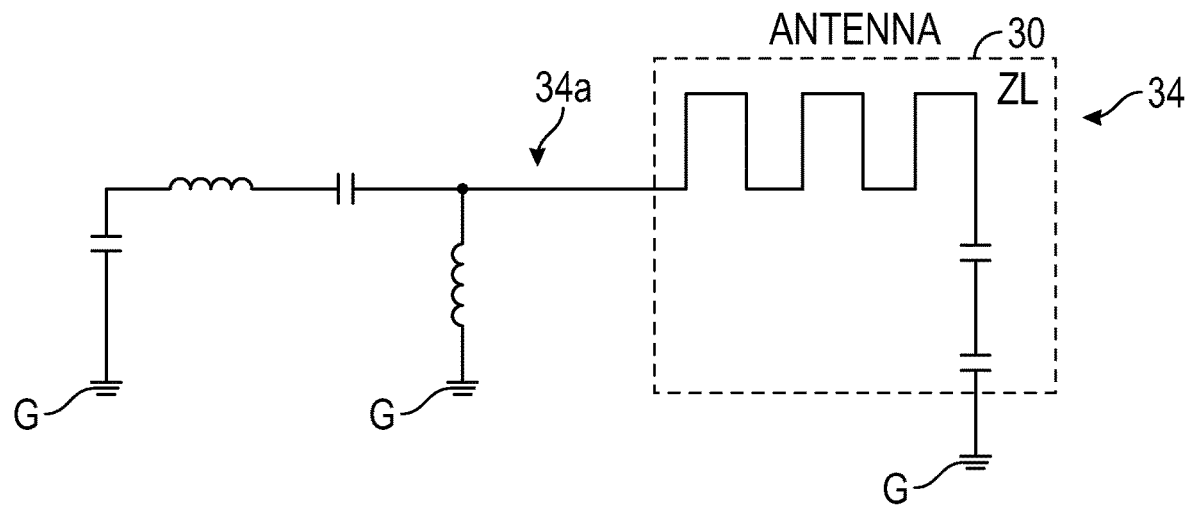
FIG. 3 is a circuit diagram for a low band antenna.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION OF AN EMBODIMENT

As shown in one example in FIG. 1, a remote signal communication system for a vehicle 10 includes a remote communications unit 12 in the vehicle 10 that wirelessly communicates with a device 14 that could comprise a key fob for a RKE system or a PASE system, or a smart key, smart card, etc. In one example, the device 14 comprises a support structure or a housing 16 with a plurality of input members 18, such as buttons for example. The input members 18 for a key fob could also comprise touch interfaces such as capacitive or resistive sensors, passive interfaces with PASE functionality, or remote interfaces using wireless connections, e.g. Bluetooth, to other devices such as a connection to a smart device (phone, tablet, etc.), The input members 18 are each associated with a unique vehicle function such as engine start, door lock/unlock, emergency alarm, trunk/hatch open and close, etc. Located within the housing 16 is a power supply 20, such as a battery for example, a control 22, and a transmitting unit 24. In one example, the control 22 comprises a processor-based control or microchip that executes one or more programs that are stored in memory. The transmitting unit 24 can comprise a transmitter, transmitter/receiver, transceiver, transponder, etc., Which transmits data signals generated by the control 22. The signals are sent by the transmitting unit 24 via an antenna system 26.

The signals are received by the remote communications unit 12 in the vehicle 10. In one example, the remote communications unit 12 comprises an electronic control module ECM that is connected to vehicle locks 50 and a vehicle engine 52. In the example of a RKE system with a key fob, the device 14 sends a signal to the remote communications unit 12 on the vehicle, which verifies the signal and generates a control signal to initiate a desired action. In the example of a PASE system, the remote communications unit 12 sends an inquiry signal from the vehicle 10 to check for transmission from the device 14 within a set proximity to the vehicle 10. The communications from the remote communications unit 12 to the device 14 are sent using LF signals from an LF sender 54 and can occur periodically or in response to an action initiated by a user, such as touching a door handle for example.

The device 14 includes a LF receiver 56 that receives communication signals from the remote communications unit 12. When the LF receiver 56 receives the inquiry signal, the device 14 sends an answering signal back to the remote communications unit 12. The answering signal from the device 14 to the remote communications unit 12 is sent using a radio frequency (RF) signal on an RF channel. The device 14 includes the transmitting unit 24 that sends the answering signal, and the remote communications unit 12 includes an RF receiver 60 to receive the answering signal from the device 14. When the answering signal is received, the remote communications unit 12 sends a control signal to the vehicle locks 50 or engine 52, for example, to initiate the desired action. Similarly, the remote communications unit 12 can send a control signal to the vehicle locks 50 or engine 52 when the remote communications unit 12 determines that the device 14 is no longer within a predetermined distance of the vehicle 10.

Figure 4:
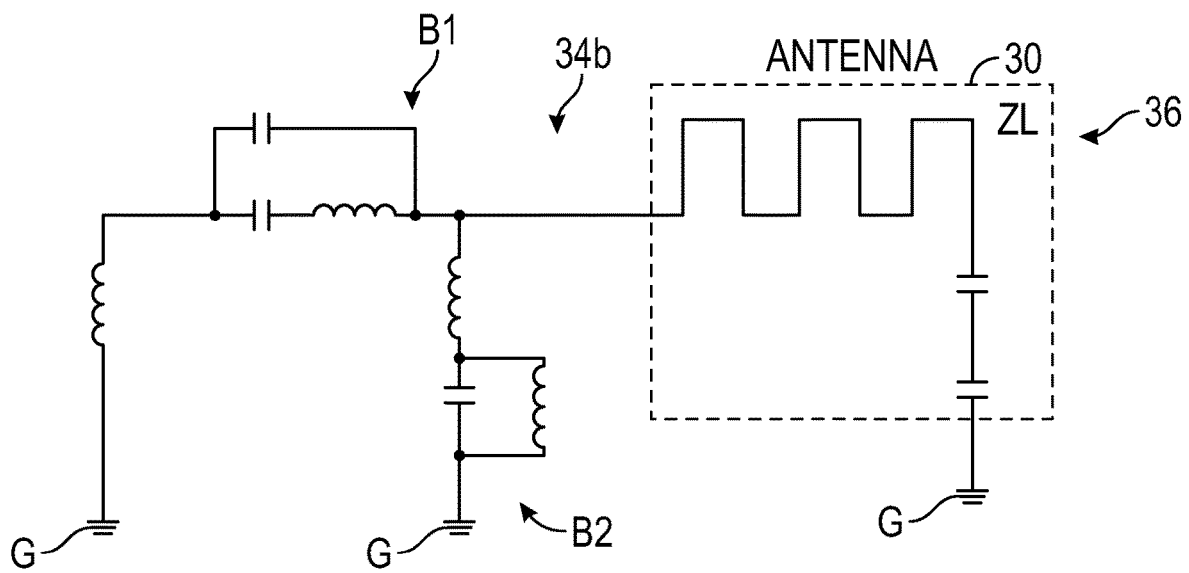
FIG. 4 is a circuit diagram for a high band antenna.

In one example, the transmitting unit 24 of the device 14 includes a support structure 16 with an antenna system 26 that is shown in greater detail in FIGS. 2-4. A first antenna 30 transmits first frequency bands and a second antenna 32 transmits second frequency bands that are higher than the first frequency bands. There is a first dual matching network 34 (FIG. 3) for the first frequency bands and a second dual matching network 36 (FIG. 4) for the second frequency bands. The first 34 and second 36 dual matching networks are comprised of various electrical components and connections as generally indicated at 40 in FIG. 2. The antenna system 26 and control 22 cooperate to provide the device 14 with a multi-frequency transceiver to perform multiple vehicle functions. In one example, the transceiver comprises a receiver for a LF state and a transmitter for a HF state that includes the disclosed antenna system 26.

In one example, the first antenna 30 is larger than the second antenna 32 as shown in FIG. 2. The first frequency bands comprise a first frequency and a second frequency that is higher than the first frequency. The second frequency bands comprise a third frequency that is higher than the second frequency and a fourth frequency that is higher than the third frequency. In one example, the first frequency is 315 MHz, the second frequency is 434 MHz, the third frequency is 868 MHz, and the fourth frequency is 902 MHz. This is just one example, and it should be understood that other combinations of frequencies could also be used.

As such, the antenna system 26 provides a set of two antennas 30, 32 that interact with each other in combination with a dual band matching network 34 for low bands (315 and 434 MHz) and a dual band matching network 36 for higher bands (868 and 902 MHz). The two antennas 30, 32 are designed to transmit four frequencies. The bigger antenna 30 is intended for the lower bands (315 and 434 MHz) and the smaller antenna 32 is intended for the higher bands (868 and 902 MHz). This transmission scheme reduces the probability of having issues with harmonics due to frequency mixing.

The high band antenna 32 is smaller when compared to prior configurations. The size and separation of the high band antenna 32 is designed in such a way that the proximity effect of the low band antenna 30 helps in maintaining an acceptable gain and efficiency. The antennas 30, 32 work as a system that helps to maintain the desired level of performance while reducing the overall size. This allows for the implementation of a four frequency system in the same space as a single frequency system that is located within a traditional remote communication device The dual band matching networks 34, 36 allow the system to transmit the four frequencies via the two antennas 30, 32. There is a tuning process for the low band (315 and 434 MHz) and high band (868 and 902 MHz) networks. The feeding 38 (FIG. 2) and grounding of the antennas 30, 32 are also designed to ensure low signal coupling while maintaining the positive effect of gain increase on the smaller antenna 32.

The low band matching network 34 for lower frequencies uses a four component matching network designed in cascade. In order to tune the lower band's antenna a dual band matching circuit 34a is utilized. This is comprised of four components (two components for each frequency) creating a cascade tuning circuit. This creates two resonances in the antenna response, e.g. 315 MHz and 434 MHz. In the example shown, there is a first capacitor C1 and a first inductor L1 and there is a second capacitor C2 and a second inductor L2. The antenna branch 30 of the circuit includes a third capacitor C3 and a fourth capacitor C4. The circuit is grounded as indicated at G.

In one example, the first capacitor C1 is directly between ground G and the first inductor L1, which is in series with the second capacitor C2, and wherein the second inductor L2 is connected to ground G. Thus, the dual band matching circuit 34a includes components 40 within the key fob, e.g. C1, L1, C2, L2, that are configured to create the cascade tuning circuit. This first set of components feeds into the antenna branch 30 of the first dual band matching circuit 34a, which includes the third capacitor C3 in series with a fourth capacitor C4 that is connected to ground G.

The high band matching network 36 for the higher frequencies uses a seven component network that addresses the problem of two frequencies being so close together for dual band tuning and so far apart for a single band tuning. In order to tune the higher band's antenna 32, a pi network 34b is used, Two branches B1, B2 of the pi network are built with three components each. Each branch B1, B2 presents a different impedance for each frequency. Thus, there are two tuning circuits in one due to the frequency dependent behavior of the components. The calculation of the components is done via computer optimization.

In one example, the high band circuit includes a first inductor L1 prior to the first branch B1. Branch B1 includes a first capacitor C1, a second capacitor C2, and a second inductor L2 in branch B1. Branch B2 includes a third inductor L3, a fourth inductor L4, and a third capacitor C3. The antenna branch 32 of the circuit includes a fourth capacitor C4 and a fifth capacitor C5. The circuit is grounded as indicated at G.

In one example, the first C1 and second C2 capacitors are in parallel and the second inductor L2 is in series with the second capacitor C2. The third inductor L3 is in series with the third capacitor C3, which is in parallel to the fourth inductor L4. These components then feed into the antenna branch 32, which includes the fourth capacitor C4 in series with the fifth capacitor C5 that is connected to ground G.

The subject antenna arrangement keeps the device size small as compared to the traditional approach where a set of four bigger antennas would be needed. Further, this approach avoids the use of switches to change a frequency to be transmitted. In addition, there are only two feeding lines 38 for four frequencies and there is a defined process to create the tuning for the antennas 30, 32.

Thus, the subject disclosure provides a transmission in four different frequency bands with a single remote communication device. This is an advantage over other systems that address this issue by indicating a frequency range (300 MHz to 450 MHz, for example) that is limited, and which is solved by the use of baluns (transformers used to convert unbalanced signals) that do not offer the best solution in terms of transmission efficiency. The traditional configuration thus offers compromises in order to transmit in a certain limited bandwidth with the drawback of losing efficiency and range. The subject disclosure provides perfectly matched antennas at each transmitted frequency and has a similar range performance as compared to a single frequency remote communication device, but which is also in a smaller housing. The four frequency bands are also transmitted in combination with keeping good return loss in order to ensure good transmission efficiency.

It should also be understood that although a particular component arrangement is disclosed in the illustrated embodiment, other arrangements will benefit herefrom. Although particular step sequences are shown, described, and claimed, it should be understood that steps may be performed in any order, separated or combined unless otherwise indicated and will still benefit from the present disclosure.

Although the different examples have specific components shown in the illustrations, embodiments of this disclosure are not limited to those particular combinations. It is possible to use some of the components or features from one of the examples in combination with features or components from another one of the examples.

Although an example embodiment has been disclosed, a worker of ordinary skill in this art would recognize that certain modifications would come within the scope of the claims. For that reason, the following claims should be studied to determine their true scope and content.

The invention claimed is:

1. A remote signal communication system comprising:
a first antenna that transmits first frequency bands;
a second antenna that transmits second frequency bands that are higher than the first frequency bands;
a first dual matching network for the first frequency bands; and
a second dual matching network for the second frequency bands
wherein the first dual matching network comprises a first dual band matching circuit comprised of a first set of components to create a cascade tuning circuit, and wherein the second dual matching network comprises a second dual band matching circuit comprised of a second set of components to provide two tuning circuits.

2. The system according to claim 1, wherein the first antenna is larger than the second antenna.

3. The system according to claim 1, wherein the first frequency bands comprise a first frequency and a second frequency that is higher than the first frequency, and wherein the second frequency bands comprise a third frequency that is higher than the second frequency and a fourth frequency that is higher than the third frequency.

4. The system according to claim 1, wherein the first and second antennas are mounted to a support structure that comprises a remote communication device that communicates with a vehicle remote communications unit.

5. The system according to claim 1, wherein the first set of components creates two different resonances in an antenna response, and wherein the first set of components include a first capacitor and a first inductor and a second capacitor and a second inductor, and wherein the first capacitor is directly between ground and the first inductor, which is in series with the second capacitor, and wherein the second inductor is connected to ground.

6. The system according to claim 5, wherein the first set of components feed into an antenna branch of the first dual band matching circuit that includes a third capacitor in series with a fourth capacitor that is connected to ground.

7. The system according to claim 1, wherein the second set of components includes a pi network with first and second branches that present a different impedance for each frequency.

8. The system according to claim 7, wherein the first and second branches each include three components with a first inductor being connected between ground and the first branch, and wherein the first branch includes a first capacitor, a second capacitor, and a second inductor, and wherein the second branch includes a third inductor, a fourth inductor, and a third capacitor.

9. The system according to claim 8, wherein first and second capacitors are in parallel and the second inductor is in series with the second capacitor, and wherein the third inductor is in series with the third capacitor which is in parallel to the fourth inductor.

10. The system according to claim 9, wherein the second set of components feed into an antenna branch of the second dual band matching circuit that includes a fourth capacitor in series with a fifth capacitor that is connected to ground.

11. A remote signal communication system comprising:
a first antenna that transmits first frequency bands;
a second antenna that transmits second frequency bands that are higher than the first frequency bands, and wherein the first and second antennas are mounted to a support structure that comprises a remote communication device that communicates with a vehicle remote communications unit;
a first dual matching network for the first frequency bands; and
a second dual matching network for the second frequency bands;
wherein the first frequency bands comprise a first frequency and a second frequency that is higher than the first frequency, and wherein the second frequency bands comprise a third frequency that is higher than the second frequency and a fourth frequency that is higher than the third frequency; and
wherein the first dual matching network comprises a first dual band matching circuit comprised of a first set of components to create a cascade tuning circuit, and wherein the second dual matching network comprises a second dual band matching circuit comprised of a second set of components to provide two tuning circuits.

12. The system according to claim 11, wherein the first antenna is larger than the second antenna.

13. The system according to claim 12, wherein the first set of components includes only four components that create two different resonances in an antenna response, and wherein the second set of components includes only seven components to provide two tuning circuits.

14. The system according to claim 13, wherein the first set of components includes a first capacitor and a first inductor and a second capacitor and a second inductor, and wherein the first capacitor is directly between ground and the first inductor, which is in series with the second capacitor, and wherein the second inductor is connected to ground.

15. The system according to claim 14, wherein the first set of components feed into an antenna branch of the first dual band matching circuit that includes a third capacitor in series with a fourth capacitor that is connected to ground.

16. The system according to claim 15, wherein the second set of components includes a pi network with first and second branches that present a different impedance for each frequency, and wherein the first and second branches each include three components with a first inductor being connected between ground and the first branch, and wherein the first branch includes a first capacitor, a second capacitor, and a second inductor, and wherein the second branch includes a third inductor, a fourth inductor, and a third capacitor.

17. The system according to claim 16, wherein first and second capacitors are in parallel and the second inductor is in series with the second capacitor, and wherein the third inductor is in series with the third capacitor which is in parallel to the fourth inductor, and wherein the second set of components feed into an antenna branch of the second dual band matching circuit that includes a fourth capacitor in series with a fifth capacitor that is connected to ground.

18. A method comprising:
- providing a first antenna and a second antenna that are associated with a support structure that comprises a remote communication device that communicates with a vehicle remote communications unit;
- transmitting first frequency bands with the first antenna;
- transmitting second frequency bands with the second antenna, wherein the second frequency bands are higher than the first frequency bands;
- providing a first dual matching network for the first frequency bands that creates a cascade tuning circuit that generates two resonances in an antenna response; and
- providing a second dual matching network for the second frequency bands that comprises a second dual band matching circuit comprised of a second set of components to provide two tuning circuits and includes a pi network with first and second branches that present a different impedance for each frequency.

* * * * *